United States Patent
Sin et al.

(10) Patent No.: US 11,081,575 B2
(45) Date of Patent: Aug. 3, 2021

(54) INSULATED GATE BIPOLAR TRANSISTOR DEVICE AND METHOD FOR MANUFACTURING THE SAME

(71) Applicant: ZHONG SHAN HONSON ELECTRONIC TECHNOLOGIES LIMITED, Zhongshan (CN)

(72) Inventors: Johnny Kin On Sin, Hong Kong (CN); Hao Feng, Zhongshan (CN); Song Yuan, Zhongshan (CN)

(73) Assignee: ZHONG SHAN HONSON ELECTRONIC TECHNOLOGIES LIMITED, Zhongshan (CN)

( * ) Notice: Subject to any disclaimer, the term of this patent is extended or adjusted under 35 U.S.C. 154(b) by 31 days.

(21) Appl. No.: 16/716,755

(22) Filed: Dec. 17, 2019

(65) Prior Publication Data

US 2020/0212208 A1   Jul. 2, 2020

(51) Int. Cl.
*H01L 29/739* (2006.01)
*H01L 29/06* (2006.01)
*H01L 29/66* (2006.01)
*H01L 29/417* (2006.01)
*H01L 29/08* (2006.01)

(52) U.S. Cl.
CPC ...... *H01L 29/7395* (2013.01); *H01L 29/0696* (2013.01); *H01L 29/0804* (2013.01); *H01L 29/41708* (2013.01); *H01L 29/66325* (2013.01)

(58) Field of Classification Search
CPC ........... H01L 29/41708; H01L 29/0804; H01L 29/0696; H01L 29/66325; H01L 29/407; H01L 29/402; H01L 29/0619; H01L 29/66333; H01L 29/6634; H01L 29/7395–7396; H01L 29/7398; H01L 29/7397; H01L 29/66348; H01L 2924/13055
See application file for complete search history.

(56) References Cited

U.S. PATENT DOCUMENTS

| | | | |
|---|---|---|---|
| 2011/0204413 A1 | 8/2011 | Arai et al. | |
| 2014/0077256 A1* | 3/2014 | Hikasa | H01L 29/7397 257/139 |
| 2015/0144995 A1* | 5/2015 | Takahashi | H01L 29/0649 257/139 |
| 2017/0263739 A1* | 9/2017 | Soeno | H01L 29/45 |

* cited by examiner

Primary Examiner — Jose R Diaz
(74) Attorney, Agent, or Firm — WPAT, PC (57) ABSTRACT

An insulated gate bipolar transistor (IGBT) device and a method for manufacturing the same are provided. The present disclosure relates to power semiconductor devices. In order to relieve the problem of wafer warping caused by trench stress in an IGBT manufacturing process without affecting other performance parameters of the IGBT, it provides the following technical solution: optimizing the design of arrangement densities and arrangement regions of device trenches. The present disclosure can alleviate the problem of wafer warping caused by trench stress in the IGBT manufacturing process, improve the product yield of IGBT chips, and enhance the latch-up immunity of the IGBT, so that the IGBT is more robust and durable.

12 Claims, 6 Drawing Sheets

INSULATED GATE BIPOLAR TRANSISTOR DEVICE AND METHOD FOR MANUFACTURING THE SAME

BACKGROUND

Technical Field

The present disclosure relates to power semiconductor devices, and in particular, to an insulated gate bipolar transistor (IGBT) structure and a method for manufacturing the same.

Related Art

An insulated gate bipolar transistor (referred to as IGBT hereinafter) is an important power semiconductor device which has both advantages of high-speed performance of a power MOSFET and a low resistance of a bipolar device. The IGBT has features such as high input impedance, simple control circuit, high blocking voltage, and high current conductivity. Therefore, the IGBT is widely applied to various fields of power electronic systems with medium and high power.

However, design and manufacturing of modern IGBTs, especially high-power IGBTs, are usually confronted with new difficulties. First of all, a high-power IGBT has a relatively large chip area, and the product yield of chips is more likely to be affected by the non-uniformity of the fabrication process. Particularly, traditional IGBTs usually utilize densely arranged gate trenches to increase gate channel density and reduce conduction resistance. During wafer processing of the IGBT, especially during thermal processing steps such as oxidation or junction drive-in, the trenches with a high density produce stress to the surface of the wafer, which may cause the wafer to warp. In the high-power IGBT with a larger chip area, the wafer tends to be warped to a larger extent due to a larger trench quantity. Wafer warping reduces the alignment precision of photolithography during chip processing and causes deviations in the chip structure, which further reduces the product yield of chips.

On the other hand, high-power IGBTs are usually used in important applications such as power grid and automotive/traction control. To ensure the safety of those applications, high-power IGBTs are generally required to have higher ruggedness so as to withstand abnormal working conditions such as over current and over temperature. A key requirement to improve the IGBT ruggedness is to achieve higher latch-up immunity. During high-current switching conditions, latch-up of the IGBT may occur, where the parasitic p-n junction between the p-type body region and the n$^+$ emitter region of the IGBT is turned on, causing the IGBT gate to lose control of the on-off state of the IGBT.

SUMMARY

The present disclosure is directed to a design scheme and a manufacturing method for a device structure need to be provided, to alleviate the problem of wafer warping caused by trench stress in an IGBT manufacturing process without affecting other performance parameters of the IGBT, and improve the product yield and latch-up immunity of IGBT chips.

Therefore, the present disclosure provides the following technical solutions:

An insulated gate bipolar transistor device, includes a collector electrode locates at the bottom of the device, a first semiconductor layer of a first conduction type locates above the collector electrode, a second semiconductor drift region of a second conduction type locates above the first semiconductor layer, a series of trenches extend from the upper surface of the second semiconductor drift region into the second semiconductor drift region, the trenches form at least one periodically arranged trench regions, a gate electrode is provided in the trench, and the gate electrode is isolated from an inner wall of the corresponding trench by a gate dielectric layer, and an emitter electrode locates on the top of the device, the emitter electrode is isolated from the gate electrode by an inter-layer dielectric layer. Particularly, according to different trench arrangement densities, each trench region is divided into three types of zones from outside to inside: A, B, and C. The zone A referred to as a "cell zone" includes periodically arranged trenches, the zone B referred to as a "transitional cell zone" whose trench density is equal to or less than that of zone A locates between the zone A and the zone C and the zone C referred to as a "pseudo cell zone" has a trench density less than that of the zone A and that of the zone B. Particularly, the zone B includes a sixth semiconductor region of the first conduction type.

In addition, the present disclosure further provides a method for manufacturing the foregoing novel IGBT device structure. The method includes the following steps:

forming a second semiconductor drift region;

implanting and diffusing ions of a first conduction type at the upper surface of the second semiconductor drift region, to form a semiconductor doped region, a part of the semiconductor doped region where ions are diffused in a vertical direction being located in a zone C, a part of the semiconductor doped region where ions are diffused in both vertical and horizontal directions being located in a zone B, and a zone A being formed on an external side of the transitional cell zone, where the semiconductor doped region can share a photolithography mask with a field limiting ring of a voltage-sustaining edge-termination region, and therefore an additional photolithography step is not needed;

etching out trenches at the upper surface of the second semiconductor drift region, the trenches divide the semiconductor doped region into a sixth semiconductor region and an eighth semiconductor region, where a trench arrangement density in the zone B is equal to or less than a trench arrangement density in the zone A, and a trench arrangement density in the zone C is less than a trench arrangement density in the zone A and a trench arrangement density in the zone B;

forming a gate dielectric layer on an inner wall of the trench, and filling the trench with a conducting material to form a gate electrode;

implanting and diffusing ions of the first conduction type at the upper surface of the second semiconductor drift region, to form a third semiconductor region in the zone A;

forming a fourth semiconductor region, a fifth semiconductor region, and a seventh semiconductor region above the third semiconductor region by means of ion implantation and annealing;

forming an inter-layer dielectric layer on the surface of the device by means of chemical vapor deposition;

etching the inter-layer dielectric layer in the zone A and the zone B, to form an emitter contact hole;

depositing a metal layer on the surface of the device to form an emitter electrode;

thinning the second semiconductor drift region on the backside of the device;

forming a first semiconductor layer on the backside of the second semiconductor drift region by means of ion implantation and activation; and depositing a metal layer at the bottom of the device, to form a collector electrode.

DETAILED DESCRIPTION

Implementations of an IGBT device and a method for manufacturing the same according to some embodiments are described below with specific examples.

It should be noted that, in the following description of embodiments of the IGBT device, a semiconductor substrate of the IGBT device is considered as made of a silicon (Si) material. However, the substrate may also be made of any other material suitable for manufacturing an IGBT, for example, germanium (Ge) and silicon carbide (SiC). In the following description, a dielectric material of the IGBT device may consist of silicon oxide ($SiO_x$). However, other dielectric materials may also be used, for example, silicon nitride ($Si_xN_y$), alumina ($Al_xO_y$), and silicon oxynitride ($Si_xN_yO_z$). Conduction types of semiconductor regions are classified into a p type (first conduction type) and an n type (second conduction type). A p-type conduction semiconductor region may be formed by doping an original semiconductor region with at least one impurities. The impurities may be, but are not limited to: boron (B), aluminum (Al), gallium (Ga), and the like. An n-type conduction semiconductor region may also be formed by doping an original semiconductor region with at least one impurities. The impurities may be, but are not limited to: phosphorus (P), arsenic (As), tellurium (Sb), selenium (Se), proton ($H^+$), and the like. In the following description, a heavily-doped p-type conduction semiconductor region is denoted as a $p^+$ region, and a heavily-doped n-type conduction semiconductor region is denoted as an $n^+$ region. For example, in a silicon substrate, an impurity concentration of a heavily-doped region is generally between $1\times10^{19}$ $cm^{-3}$ to $1\times10^{21}$ $cm^{-3}$, unless otherwise specified. In the following description, a lightly-doped p-type conduction semiconductor region is denoted as a $p^-$ region, and a lightly-doped n-type conduction semiconductor region is denoted as an $n^-$ region. For example, in a silicon substrate, an impurity concentration of a lightly-doped region is generally between $1\times10^{12}$ $cm^{-3}$ to $1\times10^{15}$ $cm^{-3}$, unless otherwise specified. In addition, an IGBT device with an n-type MOS channel is used as an example for description in the following embodiments, but it should be noted that these technical features are also applicable to an IGBT device with a p-type MOS channel.

Figure 1:
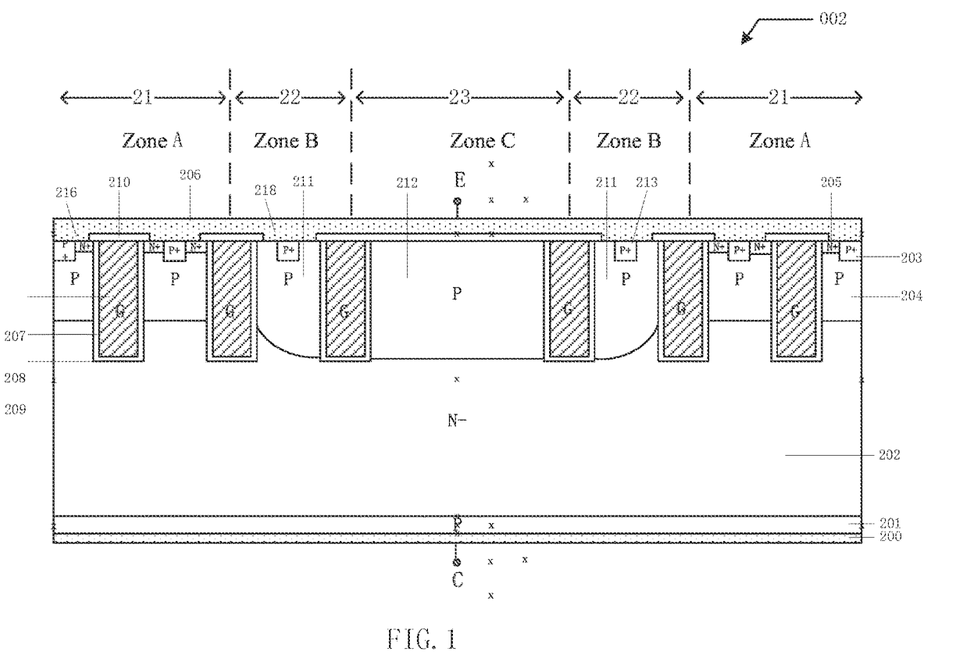
FIG. 1 is a cross-sectional schematic structural diagram of an IGBT device 002.

FIG. 1 is a cross-sectional schematic structural diagram of an IGBT device 002. The device 002 includes: a collector electrode (an electrode C, 200) located at the bottom of the device; a p-type collector electrode layer (namely, a first semiconductor layer of a first conduction type, 201) located above the collector electrode (200); an $n^-$-type drift region (namely, a second semiconductor drift region of a second conduction type, 202) located above the p-type collector electrode layer (201); at least one periodically arranged trench regions located above the $n^-$-type drift region (201), the trench region including a series of trenches (209) extending from an upper surface of the $n^-$-type drift region (202) into the $n^-$-type drift region (202), a gate electrode (207) being provided in each trench (211), and the gate electrode (207) being isolated from an inner wall of the corresponding trench (209) by a gate dielectric layer (208); and an emitter electrode (206) located on the top of the device. The emitter electrode (206) is isolated from the gate electrode (207) by an inter-layer dielectric layer (210). Particularly, according to different arrangement densities of trenches (209), each trench region is divided into three types of zones: A (21), B (22), and C (23), from outside to inside. The zone A (21) includes periodically arranged trenches (209), and is referred to as a "cell zone"; the zone B (22), located between the zone A (21) and the zone C (23), has a trench density equal to or less than that of the zone A (21), is referred to as a "transitional cell zone"; and the zone C (23) has a trench density less than that of the zone A (21) and that of the zone C (23), and is referred to as a "pseudo cell zone". In the zone A (21) and the zone B (22), a distance between adjacent trenches may be 1 to 3 µm, which is close to the trench density of the traditional trench gate IGBT. The trench density in the zone C (23) is less than the trench density of the traditional trench gate IGBT, and a distance between adjacent trenches in the zone C (23) may be 5 to 20 µm.

In addition, the zone A (21) further includes: a p-type body region (namely, a third semiconductor region of the first conduction type, 204) located above the $n^-$-type drift region (202) and adjacent to a sidewall of the trench (209), an $n^+$ emitter region (namely, a fourth semiconductor region of the second conduction type, 205) located above the p-type body region (204) and adjacent to a sidewall of the trench (209), and a $p^+$ contact region (namely, a fifth semiconductor region of the first conduction type, 203) located above the p-type body region (204). The n+ emitter region (205) and the $p^+$ contact region (203) are connected to the emitter electrode (206) through an emitter contact hole (216).

In addition, the zone B (22) further includes: a p-type transitional doped region (namely, a sixth semiconductor doped region, 211) located above the $n^-$-type drift region (202) and connected to the emitter electrode (206) through a $p^+$ contact region (namely, a seventh semiconductor doped region, 213) above the p-type transitional doped region and an emitter contact hole (218). Particularly, a depth of a part of the p-type transitional doped region (211) close to the zone C (23) is greater than a depth of a part thereof close to the zone A (21). A doping concentration of a part of the p-type transitional doped region (211) close to the zone C (23) is greater than a doping concentration of a part thereof close to the zone A (21). An average doping concentration of the p-type transitional doped region (211) is greater than an average doping concentration of the third semiconductor region (204) in the zone A (21).

In addition, the zone C (23) further includes: a p-type well region (namely, an eighth semiconductor doped region, 212) located above the $n^-$-type drift region (202). The p-type well region (212) is in an electrically floating state, and a junction depth of the p-type well region (212) is greater than a junction depth of the p-type body region (204) in the zone A (21).

The operating principle of the IGBT device 002 in this embodiment is now explained as follows: The trench density in the zone A (21) of the IGBT device 002 is close to the trench density of the traditional trench gate IGBT, and the trench density in the zone C (23) is less than the trench density of the traditional trench gate IGBT. Therefore, the total trench quantity and average trench density of the IGBT structure are less than those of the traditional trench gate IGBT. As stated above, reducing the trench density helps reduce stress introduced by trenches, thereby suppressing wafer warping, improving the process uniformity of the large-area chips, and hence increasing the product yield of high-power IGBT chips.

It should be noted that, although the IGBT device 002 has a relatively low trench density, it does not adversely affect the chip performance of the IGBT. On one hand, when the IGBT device 002 is in an on state, since there is no emitter contact hole in the zone C (23), that is, the semiconductor region in the zone C (23) is not directly connected to the emitter electrode (206), hole carriers in this zone are inhibited from drifting to the emitter electrode (206), thereby increasing the concentration of hole carriers in this zone. Correspondingly, the concentration of carriers in the n⁻-type drift region (202) near the zone C (23) will also be increased, thereby reducing the resistance of the n⁻-type drift region (202). For a high-voltage IGBT power device, the resistance of the drift region is a main component of the on resistance of the device. Therefore, although the resistance of the MOS channel is increased due to a lower average trench density, the overall on resistance of the IGBT device can still be reduced by reducing the resistance of the n⁻-type drift region (202). On the other hand, when the IGBT is in an off state, by providing a p-type well region (212) with a deep junction depth in the zone C (23), the electric field in this zone can be effectively reduced, thereby avoiding a decrease in the breakdown voltage caused by the decrease in the trench density and maintaining the voltage blocking capability of the IGBT device 002.

In addition, when the IGBT device 002 switches from the on state to the off state, all hole carriers stored in the zone C (23) need to be removed towards the emitter electrode (206). Because there is no emitter contact hole in the zone C (23), the hole carriers stored in the zone C (23) will flow to the emitter contact holes (216, 218) in the zone B (22) and the zone A (21) nearby, so as to reach the emitter electrode (206). Considering that the numerous holes originally stored in the zone C (23) may cause a relatively high hole current, the p-type transitional doped region (211) in the zone B (22) has a special doping pattern design, to avoid latch-up of the IGBT device 002. As described above, the part of the p-type transitional doped region (211) close to the zone C (23) has a higher doping concentration and a larger junction depth, so as to reduce the resistance of the zone against the holes. Therefore, a majority of the hole carriers from the zone C (23) tend to flow to the emitter contact hole (218) in the zone B (22) through the p-type transitional doped region (211) in the zone B (22), and only few hole carriers flow to the zone A (21). In this way, a parasitic PN junction between the p-type body region (204) and the n+ emitter region (205) in the zone A can be prevented from being turned-on, thereby enhancing the latch-up immunity of the IGBT device 002. In addition, because the doping concentration of the p-type body region (204) in the zone A (21) remains unchanged, the threshold voltage of the IGBT device 002 is not affected.

According to the operating principle of the IGBT device 002, corresponding structure parameters thereof may be designed as follows: It should be noted that, the structure parameters of the IGBT device are related to a rated voltage thereof. In the following, a 600V-grade IGBT is taken as an example to provide corresponding structure design parameters. In this embodiment, the n⁻ drift region (202) of the IGBT device 002 may have a thickness of 40 to 80 micron and a doping concentration of $5e^{13}$ to $5e^{14}$ cm$^{-3}$. The p-type collector electrode layer (201) on the backside may have a thickness of 0.2 to 1 micron and a peak doping concentration of $5e^{16}$ to $1e^{18}$ cm$^{-3}$. Each trench (209) on the surface may have a depth of 3 to 7 micron and a width of 0.5 to 2.5 micron. In the zone A (21) and the zone B (22), a distance between adjacent trenches may be 1 to 3 micron. In the zone C (23), a distance between adjacent trenches may be 5 to 20 micron. The gate dielectric layer (208) may be made of a silicon oxide material and may have a thickness of 0.05 to 0.2 micron. The inter-layer dielectric layer (210) may be made of a silicon oxide material or a silicon nitride material and may have a thickness of 0.3 to 2 micron. The p-type body region (204) may have a thickness of 1 to 4 micron and a peak doping concentration of $5e^{16}$ to $5e^{17}$ cm$^{-3}$. The p-type transitional doped region (211) may have a peak doping concentration of $1e^{17}$ to $1e^{18}$ cm$^{-3}$ and a thickness of 3 to 6 micron. The p-type well region (212) may have a doping concentration of $1e^{17}$ to $1e^{19}$ cm$^{-3}$ and a thickness of 4 to 8 micron. The n⁺-type emitter region (205) may have a junction depth of 0.1 to 0.5 micron. The p⁺-type contact region (203) may have a junction depth of 0.3 to 1.5 micron.

Figure 2:
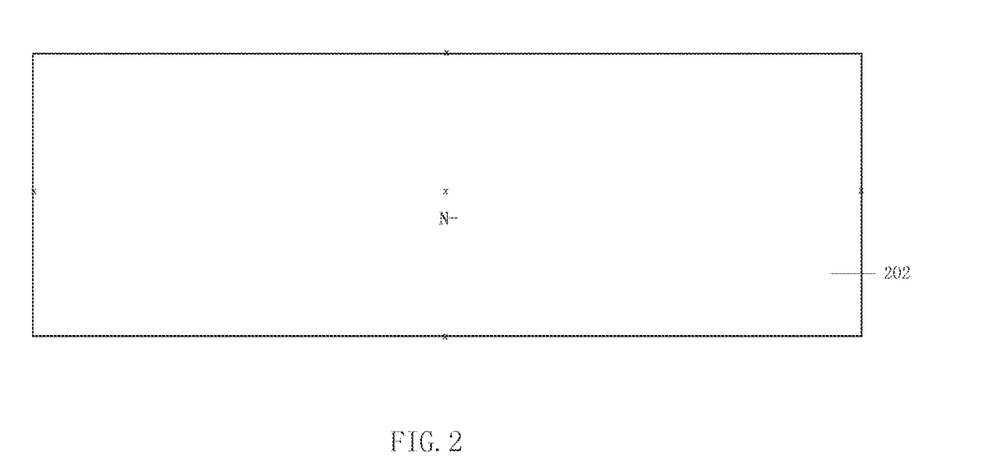
FIG. 2 to FIG. 9 are cross-sectional schematic structural diagrams of major manufacturing steps of the IGBT device 002.
Figure 3:
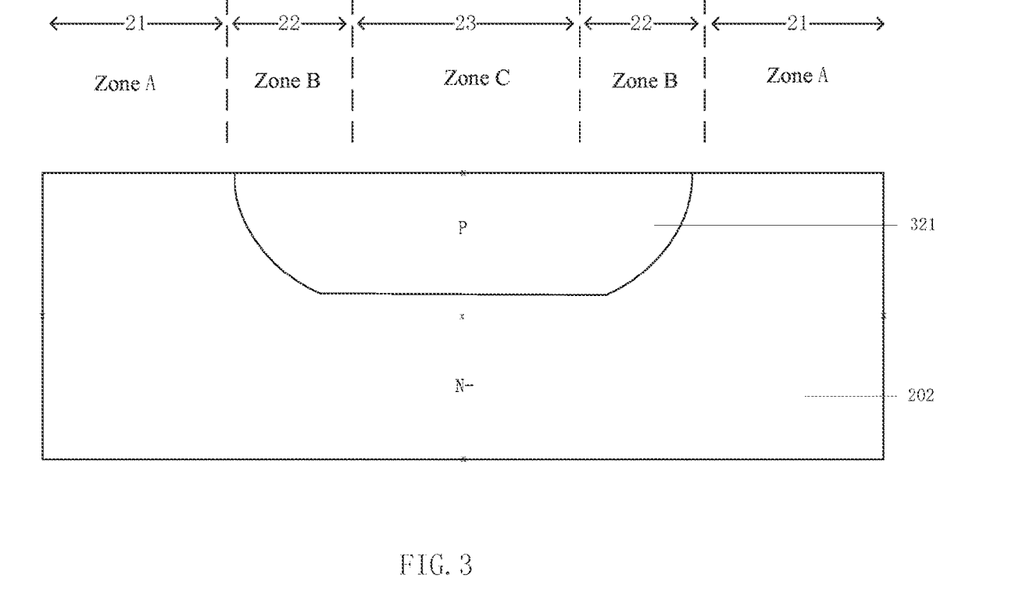
Figure 4:
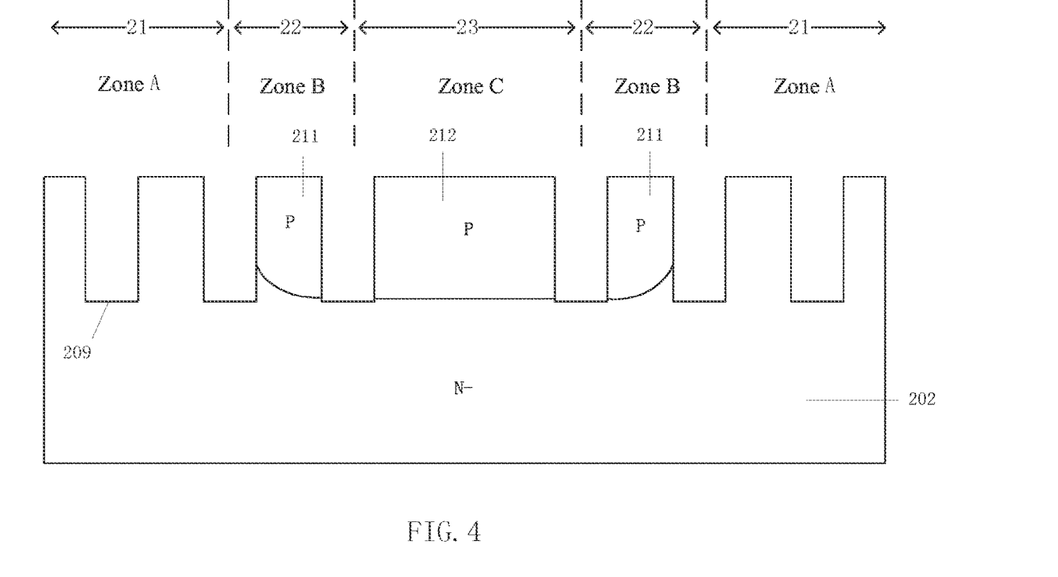
Figure 5:
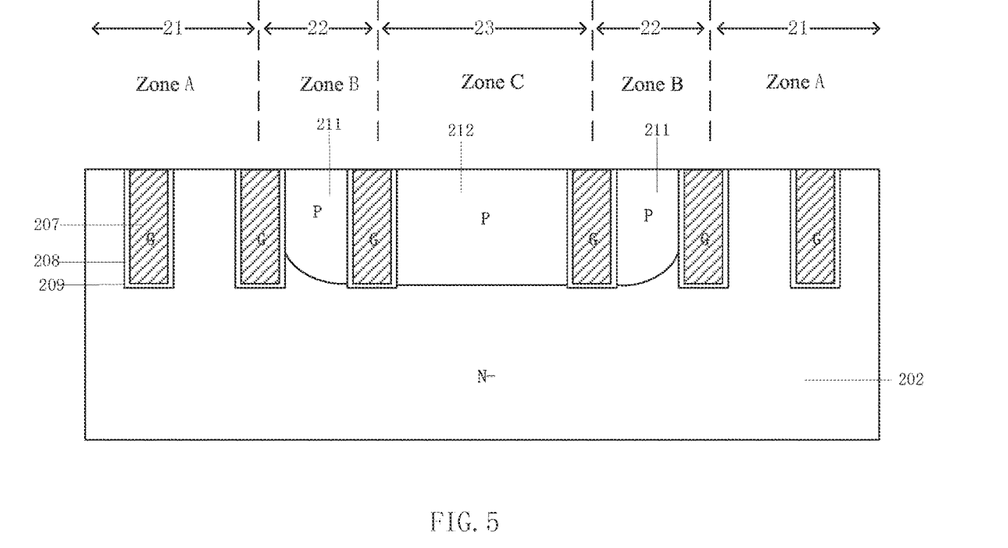
Figure 6:
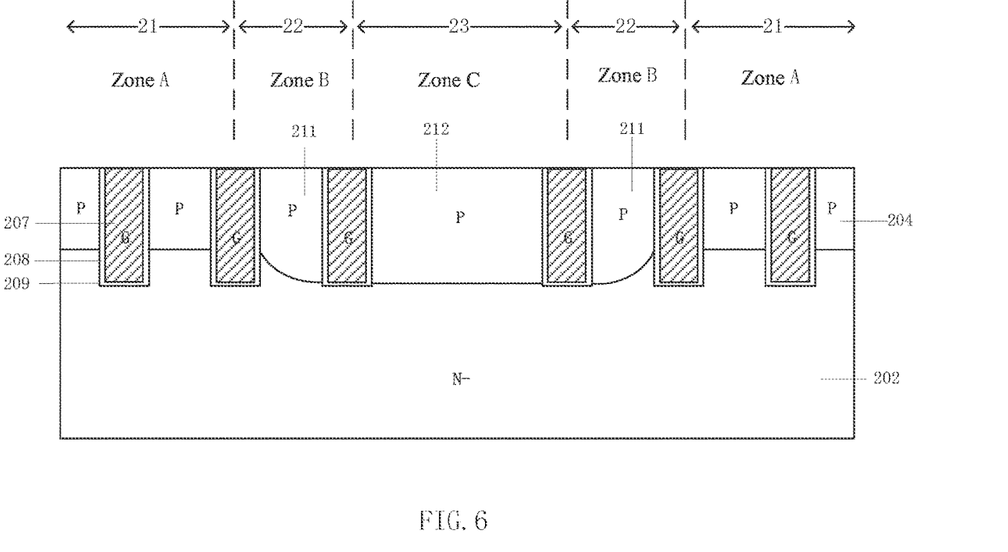
Figure 7:
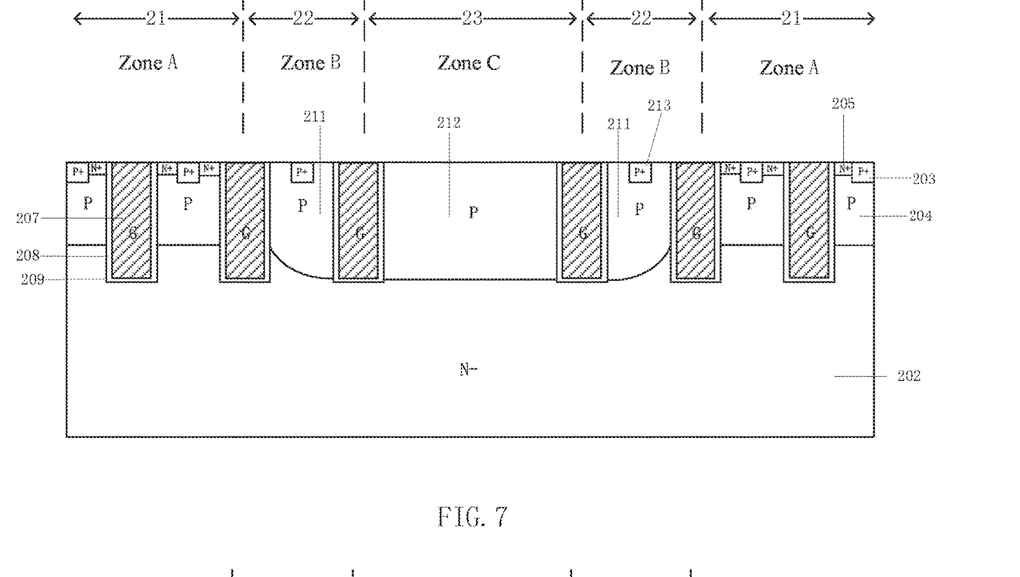
Figure 8:
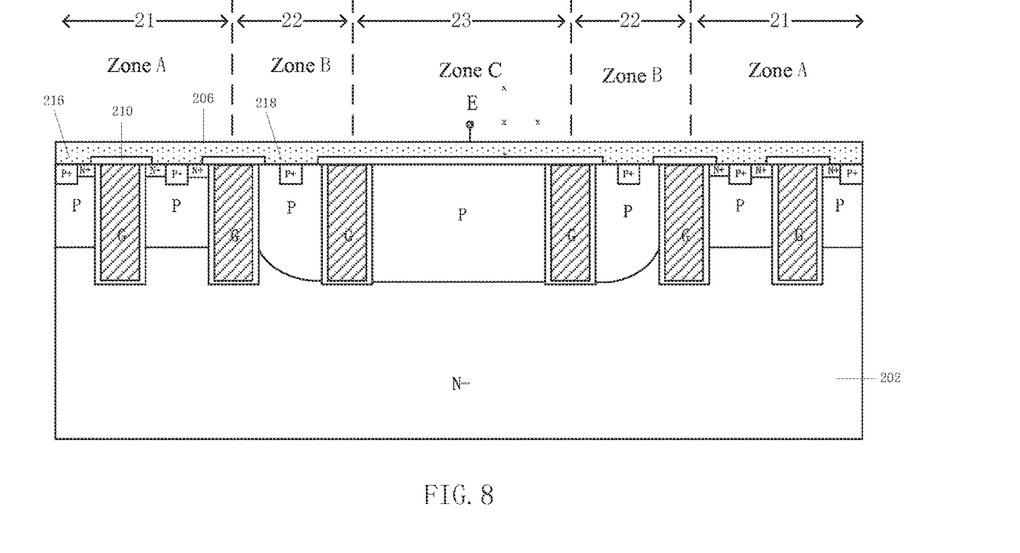
Figure 9:
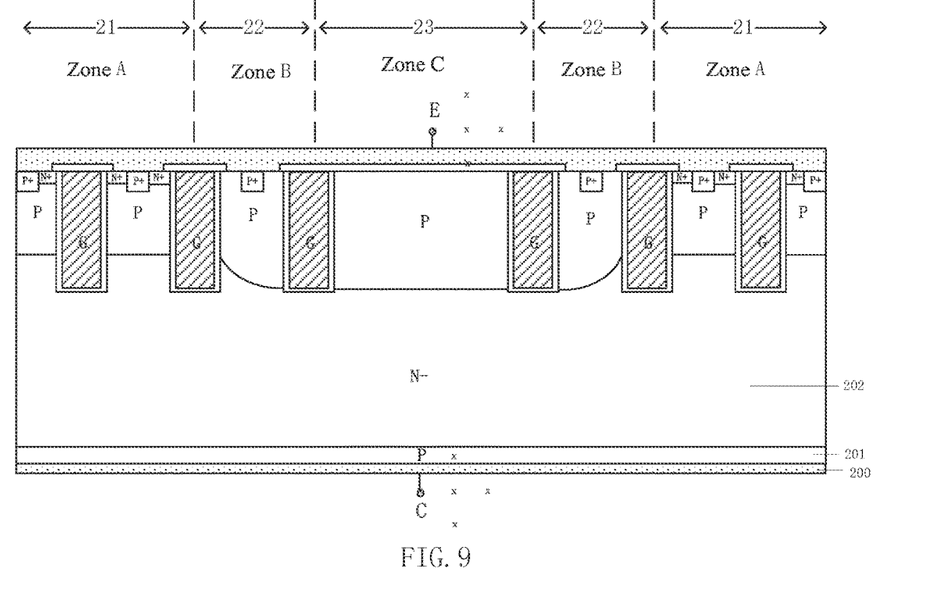

In addition, the present disclosure also provides a method for manufacturing the IGBT device 002. First, as shown in FIG. 2, a semiconductor substrate is formed to constitute an n⁻-type drift region (202). Next, as shown in FIG. 3, a p-type semiconductor doped region (321) is formed above the n⁻-type drift region (202) by means of ion implantation and diffusion. A part of the p-type semiconductor doped region (321) where ions are diffused in a vertical direction is located in a zone C (23), and a part of the p-type semiconductor doped region (321) where ions are diffused in both vertical and horizontal directions is located in a zone B (22). A zone A (21) is formed on an external side of the zone B (22). The p-type semiconductor doped region (321) can share a photolithography mask with a field limiting ring of a voltage-sustaining edge-termination region. Therefore, an additional photolithography step is not needed. Next, as shown in FIG. 4, trenches (209) are etched out on the surface of the device. An arrangement density of trenches (209) in the zone C (23) is less than that in the zone A (21). An etching method of the trenches (209) is usually anisotropic dry etching. The trenches (209) divide the p-type semiconductor doped region (321) into a p-type transitional doped region (211) located in the zone B (22) and a p-type well region (212) located in the zone C (23). Due to the effect of dopant diffusion, a doping concentration of a part of the p-type transitional doped region (211) close to the zone C (23) is greater than a doping concentration of a part thereof close to the zone A (21). Next, as shown in FIG. 5, each trench (209) is filled with a gate dielectric layer (208) and a gate electrode (207). The gate dielectric layer (208) is generally made of a material such as silicon oxide, silicon nitride, or alumina, and the gate electrode (207) is usually made of a heavily-doped polycrystalline silicon material. Next, as shown in FIG. 6, a p-type body region (204) is formed on the surface of the zone A (21) by means of ion implantation and diffusion. Next, as shown in FIG. 7, an n⁺ source region (205) and p⁺ contact doped regions (203, 213) are formed on the surface of the device by means of ion implantation and annealing. Next, as shown in FIG. 8, an inter-layer dielectric layer (210) is formed on the surface of the device by means of chemical vapor deposition, and source contact holes (216, 218) are etched out on this layer; then, an emitter metal layer is deposited on the surface of the device to form an emitter electrode (206). The emitter metal layer may be made of a material such as aluminum or an aluminum-copper alloy. Next, as shown in FIG. 9, a p-type collector electrode layer (201) is formed on the backside of the device. Before the p-type collector electrode layer (201) is formed, the thickness of the n⁻ drift region (202) may be reduced, or an n-type field stop layer may be added between the p-type collector electrode layer (201) and the n⁻ drift region (202). Finally, a metal layer is deposited on the backside of the device to form a collector electrode (200). It should be noted that, according to the foregoing manufacturing method, the IGBT device 002 in some embodiments do not need an additional photolithography mask compared with the traditional trench gate IGBT, and therefore does not increase the manufacturing cost of the IGBT chip. In conclusion, compared with the traditional trench gate IGBT structure, the IGBT device 002 can alleviate the problem of wafer warping caused by trench stress in an IGBT manufacturing process without affecting other performance parameters of the IGBT, increase the product yield of IGBT chips, and enhance the latch-up immunity of the IGBT, so that the IGBT is more robust and durable. The advantages above are particularly important for a high-power IGBT.

Figure 10:
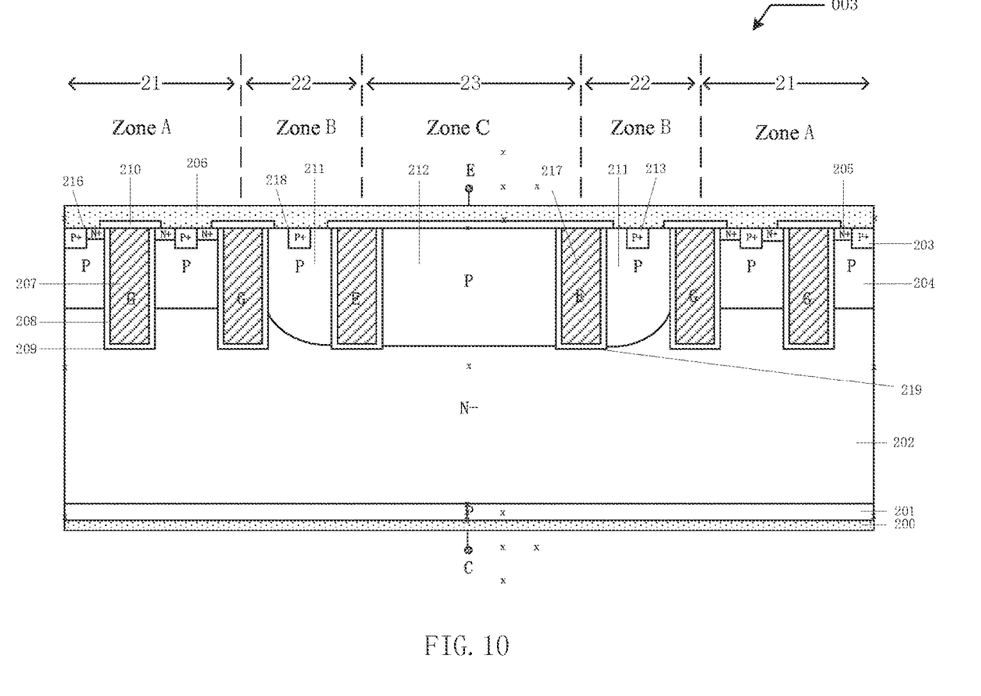
FIG. 10 is a cross-sectional schematic structural diagram of an IGBT device 003.

FIG. 10 is a cross-sectional schematic structural diagram of an IGBT device 003 according to a second embodiment of the present invention. Compared with the IGBT device 002, the device 003 further has the following features: pseudo gate trenches (219) are provided in the zone B (22) and the zone C (21); a pseudo gate electrode (217) is provided in each pseudo gate trench (219), and the pseudo gate electrode (217) is connected to the emitter electrode (206). Because no MOS channel is provided in the zone B (22) or the zone C (21), by configuring the trench (209) originally filled with the gate electrode to be the pseudo gate trench (219), gate parasitic capacitance can be reduced, thereby increasing the switching speed of the IGBT.

Figure 11:
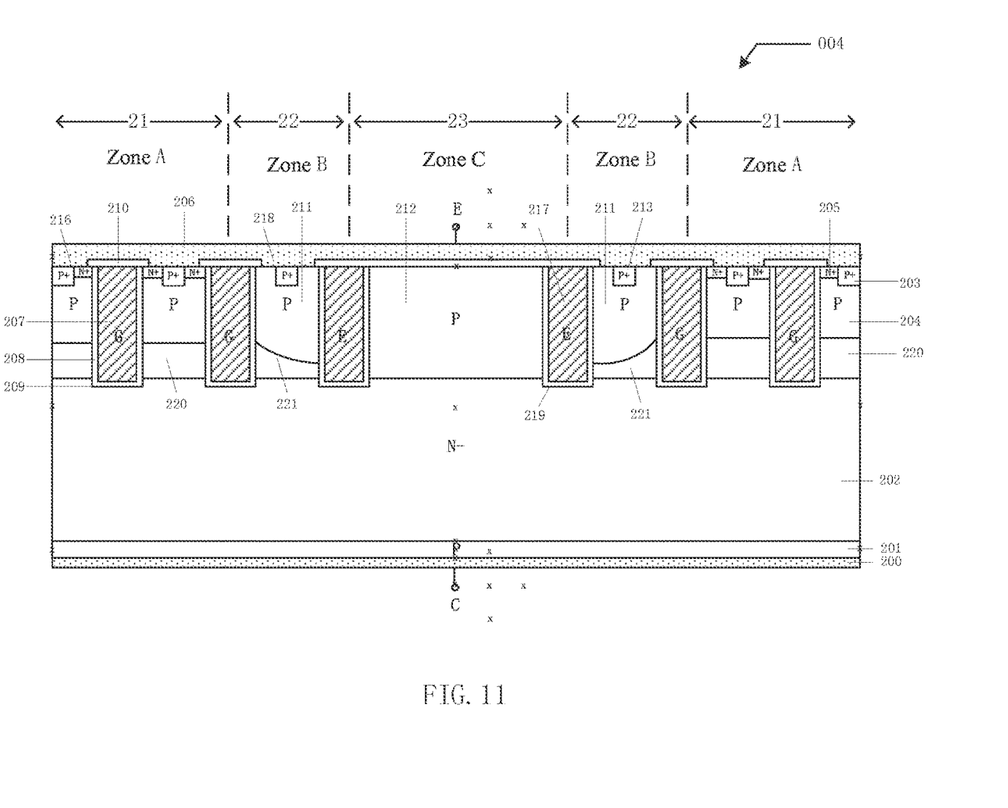
FIG. 11 is a cross-sectional schematic structural diagram of an IGBT device 004.

FIG. 3 is a cross-sectional schematic structural diagram of an IGBT device 004. Compared with the IGBT device 003, the device 004 further has the following features: an n-type buried layer (220) is provided between the p-type body region (204) and the n⁻ drift region (202), and an n-type transitional buried layer (221) is provided between the p-type transitional doped region (211) and the n⁻ drift region (202). An average doping concentration of the n-type buried layer (220) and an average doping concentration of the n-type transitional buried layer (221) are greater than a doping concentration of the n⁻ drift region (202). The n-type transitional buried layer (221) has a bottom depth the same as that of the n-type buried layer (220). In addition, due to the influence of a doping pattern of the p-type transitional doped region (211), a thickness of a part of the n-type transitional buried layer (221) close to the zone C (23) is less than a thickness of a part thereof close to the zone A (21), and the average doping concentration of the n-type transitional buried layer (221) is less than the average doping concentration of the n-type buried layer (220). In the forward conducting state of the IGBT, the n-type buried layer regions (220, 221) with a higher doping concentration form an energy barrier against hole carriers in the n⁻ drift region (202), thereby inhibiting the hole carriers from drifting to the p-type body region (204) and the p-type transitional doped region (211), increasing the concentration of hole carriers on the surface of the n⁻ drift region (202), and helping further reduce the resistance of the drift region and the conduction loss of the IGBT.

What is claimed is:

1. An insulated gate bipolar transistor device, comprising:
    a collector electrode located at the bottom of the device;
    a first semiconductor layer of a first conduction type located above the collector electrode;
    a second semiconductor drift region of a second conduction type located above the first semiconductor layer;
    at least one periodically arranged trench regions located on an upper surface of the second semiconductor drift region, at least one trenches extending from the upper surface of the second semiconductor drift region into the second semiconductor drift region being provided in each trench region, a gate electrode being provided in each trench, and the gate electrode being isolated from an inner wall of the corresponding trench; and
    an emitter electrode located on the top of the device;
    wherein,
    the trench region comprises a cell zone, a transitional cell zone, and a pseudo cell zone from outside to inside, and a trench arrangement density in the pseudo cell zone is less than a trench arrangement density in the cell zone, and a trench arrangement density in the transitional cell zone;
    wherein trenches in the transitional cell zone and the pseudo cell zone are configured to be pseudo gate trenches, each pseudo gate trench is filled with a pseudo gate electrode, and the pseudo gate electrode is connected to the emitter electrode;
    wherein a ninth semiconductor buried layer region of the second conduction type is provided between the second semiconductor drift region and the third semiconductor region, and an average doping concentration of the ninth semiconductor buried layer region is greater than a doping concentration of the second semiconductor drift region;
    wherein a tenth semiconductor buried layer region of the second conduction type is provided between the second semiconductor drift region and the sixth semiconductor region, and an average doping concentration of the tenth semiconductor buried layer region is greater than the doping concentration of the second semiconductor drift region and less than the average doping concentration of the ninth semiconductor buried layer region.

2. The insulated gate bipolar transistor device according to claim 1, wherein the cell zone comprises:
    a third semiconductor region of the first conduction type located above the second semiconductor drift region, the third semiconductor region being adjacent to a sidewall of a neighboring trench;
    a fourth semiconductor region of the second conduction type located above the third semiconductor region, the fourth semiconductor region being adjacent to the sidewall of the neighboring trench; and
    a fifth semiconductor region of the first conduction type located above the third semiconductor region;
    wherein the fourth semiconductor region and the fifth semiconductor region are connected to the emitter electrode through an emitter contact hole.

3. The insulated gate bipolar transistor device according to claim 1, wherein the transitional cell zone comprises:
    a sixth semiconductor region located above the second semiconductor drift region, the sixth semiconductor region being connected to the emitter electrode through a seventh semiconductor region of the first conduction type located above the sixth semiconductor region and an emitter contact hole.

4. The insulated gate bipolar transistor device according to claim 3, wherein a depth of a part of the sixth semiconductor region close to the pseudo cell zone is greater than a depth of a part of the sixth semiconductor region close to the cell zone.

5. The insulated gate bipolar transistor device according to claim 3, wherein a doping concentration of a part of the sixth semiconductor region close to the pseudo cell zone is greater than a doping concentration of a part of the sixth semiconductor region close to the cell zone.

6. The insulated gate bipolar transistor device according to claim 3, wherein an average doping concentration of the sixth semiconductor region is greater than an average doping concentration of the third semiconductor region.

7. The insulated gate bipolar transistor device according to claim 1, wherein the pseudo cell zone comprises an eighth semiconductor region of the first conduction type, and the eighth semiconductor region is located above the second semiconductor drift region.

8. The insulated gate bipolar transistor device according to claim 7, wherein the eighth semiconductor region is in an electrically floating state.

9. The insulated gate bipolar transistor device according to claim 7, wherein a depth of the eighth semiconductor region is greater than a depth of the third semiconductor region.

10. The insulated gate bipolar transistor device according to claim 1, wherein a depth of the ninth semiconductor buried layer region is equal to a depth of the tenth semiconductor buried layer region.

11. The insulated gate bipolar transistor device according to claim 1, wherein a thickness of a part of the tenth semiconductor buried layer region close to the pseudo cell zone is less than a thickness of a part of the tenth semiconductor buried layer region close to the cell zone.

12. A method for manufacturing an insulated gate bipolar transistor device according to claim 1, comprising the following steps:
forming a second semiconductor drift region;
implanting and diffusing ions of a first conduction type above the second semiconductor drift region, to form a semiconductor doped region, a part of the semiconductor doped region where ions are diffused in a vertical direction being located in a pseudo cell zone, a part of the semiconductor doped region where ions are diffused in both vertical and horizontal directions being located in a transitional cell zone, and a cell zone being formed on an external side of the transitional cell zone;
etching out trenches on a surface of the device, the trenches dividing the semiconductor doped region into a sixth semiconductor region and an eighth semiconductor region, wherein a trench arrangement density in the pseudo cell zone is less than a trench arrangement density in the cell zone and a trench arrangement density in the transitional cell zone; configuring trenches in the transitional cell zone and the pseudo cell zone to be pseudo gate trenches, and each pseudo gate trench is filled with a pseudo gate electrode, and the pseudo gate electrode is connected to the emitter electrode;
forming a gate dielectric layer on an inner wall of each trench, and filling the trench with a conducting material to form a gate electrode;
implanting and diffusing ions of the first conduction type above the second semiconductor drift region, to form a third semiconductor region in the cell zone; forming a ninth semiconductor buried layer region of the second conduction type between the second semiconductor drift region and the third semiconductor region, and an average doping concentration of the ninth semiconductor buried layer region is greater than a doping concentration of the second semiconductor drift region; forming a tenth semiconductor buried layer region of the second conduction type between the second semiconductor drift region and the sixth semiconductor region, and an average doping concentration of the tenth semiconductor buried layer region is greater than the doping concentration of the second semiconductor drift region and less than the average doping concentration of the ninth semiconductor buried layer region;
forming a fourth semiconductor region, a fifth semiconductor region, and a seventh semiconductor region above the third semiconductor region by means of ion implantation and annealing;
forming an inter-layer dielectric layer on the surface of the device by means of chemical vapor deposition;
etching the inter-layer dielectric layer in the cell zone and the transitional cell zone, to form an emitter contact hole;
depositing a metal layer on the surface of the device to form an emitter electrode;
thinning the second semiconductor drift region on the backside of the device;
forming a first semiconductor layer on the backside of the second semiconductor drift region by means of ion implantation and activation; and
depositing a metal layer at the bottom of the device, to form a collector electrode.

\* \* \* \* \*